(12) United States Patent
Jung et al.

(10) Patent No.: US 6,514,665 B1
(45) Date of Patent: Feb. 4, 2003

(54) ADDITIVES FOR IMPROVING POST EXPOSURE DELAY STABILITY OF PHOTORESIST

(75) Inventors: Jae Chang Jung, Kyoungki-do (KR); Keun Kyu Kong, Kwangju (KR); Geun Su Lee, Kyoungki-do (KR); Ki Ho Baik, Kyoungki-do (KR)

(73) Assignee: Hyundai Electronics Co., Ltd. (KR)

( * ) Notice: Subject to any disclaimer, the term of this patent is extended or adjusted under 35 U.S.C. 154(b) by 90 days.

(21) Appl. No.: 09/651,809

(22) Filed: Aug. 30, 2000

(30) Foreign Application Priority Data

Aug. 31, 1999 (KR) .............................. 99-36605

(51) Int. Cl.$^7$ .............................................. G03F 7/004
(52) U.S. Cl. ................. 430/270.1; 430/905; 430/286.1; 564/32; 564/43
(58) Field of Search ............................. 430/270.1, 905, 430/286.1, 919, 920; 564/32, 43, 77

(56) References Cited

U.S. PATENT DOCUMENTS

| | | | | |
|---|---|---|---|---|
| 4,330,656 A | * | 5/1982 | Grogler et al. ................ 528/82 |
| 4,444,863 A | * | 4/1984 | Sano et al. .................... 430/83 |
| 4,882,202 A | * | 11/1989 | Holtzman et al. ............. 427/98 |
| 4,931,496 A | * | 6/1990 | Qureshi et al. ................ 524/612 |
| 5,145,591 A | * | 9/1992 | Kinoshita et al. ........... 252/51.5 |
| 5,155,267 A | * | 10/1992 | Faraj ............................ 564/56 |
| 5,308,743 A | * | 5/1994 | Kobayashi et al. .......... 430/318 |
| 5,470,816 A | * | 11/1995 | Satake et al. ................ 503/201 |
| 5,612,279 A | * | 3/1997 | Satake et al. ................ 503/201 |
| 5,686,645 A | * | 11/1997 | Faraj ............................ 560/24 |
| 6,150,069 A | * | 11/2000 | Jung et al. ................ 430/270.1 |
| 6,180,316 B1 | * | 1/2001 | Kajita et al. .............. 430/270.1 |
| 6,312,865 B1 | * | 11/2001 | Jung et al. ................ 430/270.1 |
| 6,358,665 B1 | * | 3/2002 | Pawlowski et al. ...... 430/270.1 |
| 2001/0053590 A1 | * | 12/2001 | Jung et al. ................... 438/584 |
| 2002/0022197 A1 | * | 2/2002 | Jung et al. ................... 430/312 |

FOREIGN PATENT DOCUMENTS

JP 10218947 A * 8/1998 ......... C08F/232/04

OTHER PUBLICATIONS

Aldrich Handbook of Fine Chemicals and Laboratory Equipment 2000–2001, pp. 337, 704 and 1717.*

* cited by examiner

*Primary Examiner*—Janet Baxter
*Assistant Examiner*—Yvette M. Clarke
(74) *Attorney, Agent, or Firm*—Townsend and Townsend and Crew LLP

(57) ABSTRACT

The present invention relates to a compound that is useful as an additive for improving post exposure delay stability in a photoresist composition, and a photoresist composition containing the same. In particular, it has been found that a compound of the formula:

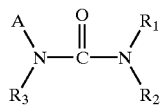

where A, $R_1$ to $R_3$ are defined herein, can efficiently prevent or reduce the phenomenon of a lack of pattern formation and T-topping resulting from post exposure delay (PED) by reducing influences of environmental amine compounds. PED is a disadvantage of alicyclic compounds used in the lithography process using light sources such as KrF, ArF, VUV, E-beam, ion beam and EUV.

18 Claims, 5 Drawing Sheets

ADDITIVES FOR IMPROVING POST EXPOSURE DELAY STABILITY OF PHOTORESIST

BACKGROUND OF THE INVENTION

1. Field of the Invention

The present invention relates to an additive for improving post exposure delay stability of a photoresist, and a composition comprising the same. In one particular aspect of the present invention, urea derivatives of the present invention are used as an additive in a chemically amplified photoresist composition that can efficiently prevent phenomena of lack of pattern formation and T-topping due to the post exposure delay (PED). PED is a disadvantage of alicyclic compounds used in the lithography process using light sources such as KrF (248 nm), ArF (193 nm), VUV (157 nm), E-beam, ion beam and EUV.

2. Description of the Background Art

Use of chemical amplification-type photoresists (i.e., photoresist compositions) is currently being investigated in photolithography processes using light source such as KrF, ArF, VUV and EUV to achieve a high sensitivity in minute image-formation on semiconductor devices. Such photoresists are generally prepared by blending a photoacid generator with a matrix resin polymer (i.e., photoresist polymer) having an acid labile group.

In a photolithography process for producing semiconductor devices, the resolution of an image depends on the wavelength of the light used. Thus, the shorter the wavelength, the higher the resolution, i.e., shorter wavelengths allow smaller pattern formation.

In order to be useful in a photolithography process, a photoresist (PR) must have an excellent etching resistance, heat resistance, and adhesiveness. Moreover, to reduce the cost of manufacturing semiconductor devices, a PR should be capable of being developed by a common developing solution, such as a 2.38 wt % aqueous tetramethylammonium hydroxide (TMAH) solution. These qualities are particularly important in photolithography processes utilizing a deep ultraviolet light source (i.e., short wavelength light source), including KrF (248 nm), ArF (193 nm), VUV (157 nm) and EUV (13 nm).

While it is difficult to synthesize a photoresist polymer that satisfies all of these requirements, a variety of photoresist polymers with improved etching resistance, adhesiveness and resolution have been developed. Unfortunately, however, most chemically amplified photoresists currently available have a relatively short post exposure delay (PED) stability. In general, when there is delay between exposure of the photoresist to light and development of the exposed photoresist, acids that are generated on the exposed area are neutralized by amine compounds which may be present in the production atmosphere. Since the pattern formation depends on acids that are generated by the exposure, neutralization of acids by atmospheric amine compounds reduce, prevent or alter a pattern formation, e.g., a T-topping phenomenon may occur where the top portion of the pattern forms a T-shape. This problem is especially acute when the concentration of environmental amine is over 30 ppb, which leads to no pattern formation.

In theory, one may overcome the aforementioned disadvantages by improving the photoresist polymer or by adding an additive to improve the PED stability of the photoresist composition. In the conventional art, various amine compounds, in particular, amine compounds that are weakly basic and/or have bulky groups, have been employed as additives to increase the PED stability. However, most of these additives dissolve relatively equally well in the exposed and unexposed regions. In addition, most of these additives are relatively volatile liquids which escape into the atmosphere during the post exposure delay; therefore, photoresists containing these amine compounds have poor reproducibility. Furthermore, since these amine compounds are volatile, it is difficult to control the precise amount of these additives present in the photoresist during a photolithography process.

Therefore, there is a need for a photoresist additive compound which overcomes the above-mentioned disadvantages.

SUMMARY OF THE INVENTION

It is therefore an object of the present invention to provide an additive compound which improves the PED stability of photoresist compositions.

It is also an object of the present invention to provide a photoresist composition comprising the aforementioned additive.

In order to achieve the above-described objectives, the present invention provides urea derivatives that can improve PED stability of a photoresist by efficiently preventing the acid generated at an exposed region from reacting with environmental amine compounds.

DETAILED DESCRIPTION OF THE PREFERRED EMBODIMENTS

Figure 1:
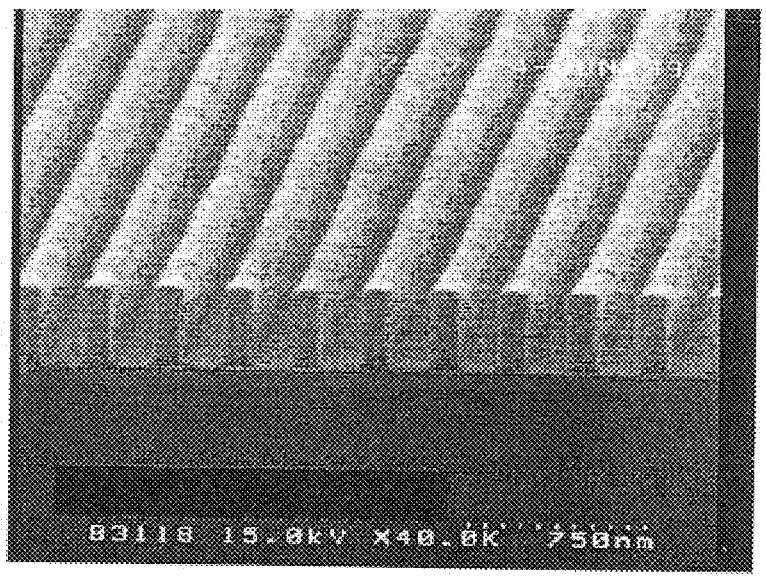
FIG. 1 shows a photoresist pattern obtained in Example 10.

The present invention provides an additive compound which achieve the above stated objectives, and a process for producing the same. The present invention also provides a photoresist composition comprising the aforementioned additive. The present invention further provides a semiconductor device fabricated by using such photoresist composition.

One aspect of the present invention provides compounds of the formula 1 that are useful as additives for a chemically amplified photoresist:

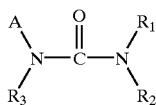

where
A is $R_7$ or a moiety of the formula

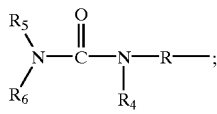

A is $R_7$ or a moiety of the formula

R presents substituted or unsubstituted linear or branched $(C_1-C_{20})$ alkylene, substituted or unsubstituted $(C_6-C_{20})$ arylene, substituted or unsubstituted $(C_1-C_{20})$ alkylene comprising an ether linkage, or substituted or unsubstituted $(C_6-C_{20})$ arylene comprising an ether linkage; and $R_1$ to $R_7$ are independently hydrogen, substituted or unsubstituted linear or branched $(C_1-C_{20})$ alkyl or substituted or unsubstituted $(C_6-C_{20})$ aryl; or $R_1$ and $R_2$, $R_5$ and $R_6$, or $R_3$ and $R_7$ taken together with the nitrogen to which they are attached forms a cyclic or a bicyclic moiety.

The compound of Formula 1 can be represented by Formulas 1a and 1b:

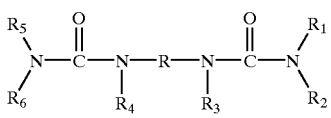

1a

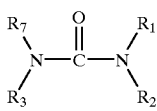

1b where R, and $R_1$ to $R_7$ are those defined above.

Compounds of Formulas 2 to 8 are preferred examples of the compound of Formula 1a:

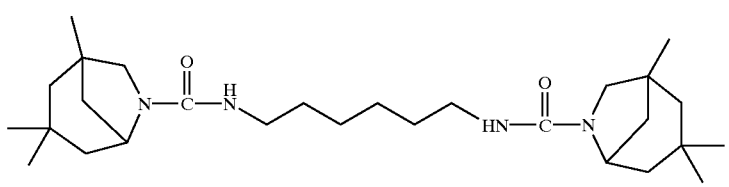

2

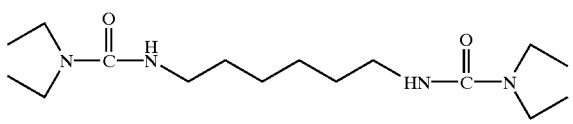

3

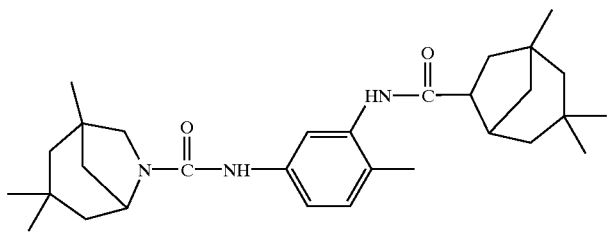

4

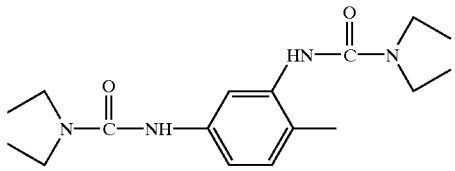

5

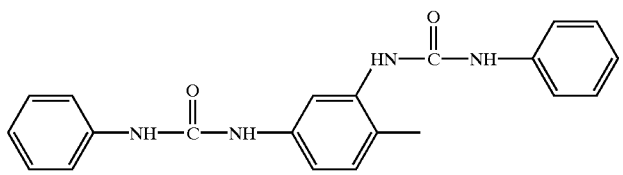

6

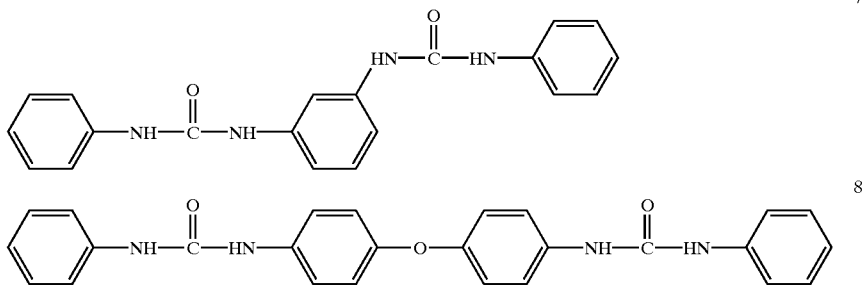

7

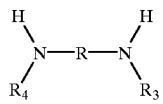

8

In addition, compounds of Formulas 9 and 10 are preferred examples of the compound of Formula 1b:

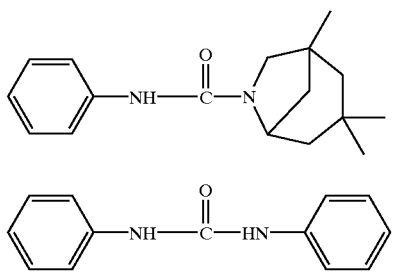

9

10

The additive compound of the present invention can be prepared by a variety of methods. One method for preparing compounds of formula 1a, where $R_3$ and $R_4$ are hydrogen, comprises admixing a diisocyanate compound of the formula:

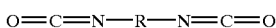

11 a first amine compound of the Formula:

12a and a second amine compound of the formula:

12b under conditions sufficient to produce the diurea compound 1a, where $R_3$ and $R_4$ are hydrogen; R is substituted or unsubstituted linear or branched $(C_1–C_{20})$ alkylene, substituted or unsubstituted $(C_6–C_{20})$ arylene, substituted or unsubstituted $(C_1–C_{20})$ alkylene comprising an ether linkage, or substituted or unsubstituted $(C_6–C_{20})$ arylene comprising an ether linkage; and $R_1$, $R_2$, $R_5$, and $R_6$ are independently hydrogen, substituted or unsubstituted linear or branched $(C_1–C_{20})$ alkyl or substituted or unsubstituted $(C_6–C_{20})$ aryl; or $R_1$ and $R_2$, or $R_5$ and $R_6$ taken together with the nitrogen to which they are attached forms a cyclic or a bicyclic moiety. Preferably the reaction is carried out in an organic solvent.

Preferably, the mole ratio between compounds of the formulas 11, 12a, and 12b is about 1:1:1. It should be appreciated that the compounds 12a and 12b can be added simultaneously, or preferably sequentially. In the above process, when the compound of Formula 12a is identical to the compound of Formula 12b, the compound of Chemical Formula 1a is preferably prepared by simply adding twice the amount of compound of Formula 12a relative to the amount of the compound of Formula 11.

In another method for preparing compounds of formula 1a, where $R_2$ and $R_6$ are hydrogen, the method comprises admixing a diamine compound of the formula:

13 a first isocyanate compound of the formula:

$$R_1-N=C=O \qquad 14a$$

and a second isocyanate compound of the formula:

$$R_5-N=C=O \qquad 14b$$

under conditions sufficient to produce the diurea compound 1a, where $R_2$ and $R_6$ are hydrogen; R is substituted or unsubstituted linear or branched $(C_1–C_{20})$ alkylene, substituted or unsubstituted $(C_6–C_{20})$ arylene, substituted or unsubstituted $(C_1–C_{20})$ alkylene comprising an ether linkage, or substituted or unsubstituted $(C_6–C_{20})$ arylene comprising an ether linkage; and $R_1$, $R_3$, $R_4$, and $R_5$ are independently hydrogen, substituted or unsubstituted linear or branched $(C_1–C_{20})$ alkyl or substituted or unsubstituted $(C_6–C_{20})$ aryl. Preferably the reaction is carried out in an organic solvent.

Preferably, the mole ratio between compounds of the formulas 13, 14a, and 14b is about 1:1:1. It should be appreciated that the compounds 12a and 12b can be added simultaneously, or preferably sequentially. In the above process, when the compound of Formula 14a is identical to the compound of Formula 14b, the compound of Chemical Formula 1a is preferably prepared by simply adding twice the amount of compound of Formula 14a relative to the amount of the compound of Formula 13.

One method for preparing urea compounds of formula 1b, where $R_2$ is hydrogen, comprises admixing an isocyanate compound of the formula:

$$R_1-N=C=O \qquad 14a$$

and an amine compound of the formula:

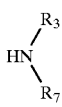

under conditions sufficient to produce the urea compound 1b, where $R_2$ is hydrogen; and $R_1$, $R_3$ and $R_7$ are independently hydrogen, substituted or unsubstituted linear or branched $(C_1-C_{20})$ alkyl or substituted or unsubstituted $(C_6-C_{20})$ aryl; or $R_3$ and $R_7$ taken together with the nitrogen to which they are attached forms a cyclic or a bicyclic moiety. Preferably, the reaction is conducted in an organic solvent.

In the above preparation process of compounds of Formula 1b, the identical resultant mixture is obtained by reacting a compound of Chemical Formula 16 with a compound of Chemical Formula 12a, instead of reacting the compound of Chemical Formula 14a with the compound of Chemical Formula 15. Here, the compound of Chemical Formula 1b where one of $R_3$ and $R_7$ is hydrogen is prepared:

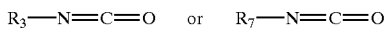

where $R_1$, $R_2$, $R_3$ and $R_7$ are those defined above.

Another embodiment of the present invention provides a photoresist composition comprising a photoresist resin (e.g., polymer), an organic solvent, a photoacid generator, and a compound of Formula 1 as an additive for enhancing the PED stability.

The photoresist resin can be any currently known chemically amplified photoresist resin, preferably a resin comprising maleic anhydride, for example, poly(2-hydroxyethyl 5-norbornene-2-carboxylate/t-butyl 5-norbornene-2-carboxylate/5-norbornene-2-carboxylic acid/maleic anhydride).

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. Typically, the amount of photoacid generator used is from about 0.05% by weight to about 10% by weight of the photoresist resin present in the composition.

The amount of compound of Chemical Formula 1 present in the photoresist composition can be preferably from about 1% by weight to about 50% by weight of the photoacid generator. Unless otherwise stated, the amount of each component present in the photoresist composition refers to the amount of each component added. It should be appreciated that the actual amount of each component may change during the lithography process.

While a variety of organic solvents are suitable for use in the photoresist composition of the present invention, the organic solvent selected from the group consisting of methyl 3-methoxypropionate, ethyl 3-ethoxypropionate, propylene glycol methyl ether acetate, cyclohexanone, 2-heptanone and (2-methoxy)ethyl acetate is preferred. The amount of organic solvent used in the photoresist composition is preferably from about 200% by weight to about 1000% by weight of the photoresist resin.

Another embodiment of the present invention provides a process for producing a photoresist pattern comprising the steps of:

(a) coating a photoresist composition on a substrate to form a photoresist film, wherein the photoresist composition comprises a photoresist resin, an organic solvent, a photoacid generator and an additive capable of improving post exposure delay stability and contrast value;

(b) exposing the photoresist film to light by using an exposer; and (c) developing the exposed photoresist film.

The process for producing the photoresist pattern can also comprise heating (e.g., baking) step(s) before and/or after exposing the photoresist film to light. The baking step is typically performed at temperature of about 70° C. to about 200° C.

As used herein, the term "light" refers to an electromagnetic wave generated by the exposer and not by an ambient light source, unless otherwise stated. Preferably, the exposer is a short wavelength light source such as ArF, KrF, VUV, EUV, E-beam, X-ray, ion beam, or combinations thereof. The exposure energy is preferably from about 1 mJ/cm² to about 100 mJ/cm².

Processes for producing a photoresist pattern typically involve spin-coating the photoresist composition of the present invention on a silicon wafer to produce a coated wafer, and "soft-baking" the coated wafer (e.g., in an oven or on a hot-plate) at a temperature of from about 80° C. to about 150° C., for about 1 to 5 minutes. The photoresist layer is then exposed to from about 0.1 mJ/cm² to about 100 mJ/cm² of light energy using an exposer, and "post-baked" at a temperature of from about 100° C. to about 200° C. The resulting post-baked wafer is developed by dipping it into an alkaline developing solution, e.g., a solution containing from about 0.01% by weight to about 5% by weight of tetramethylammonium hydroxide (TMAH), for a predetermined time, preferably about 90 seconds, to obtain an ultramicro photoresist pattern. Typically a solution containing about 2.38% by weight of TMAH is used as the developing solution.

Yet another embodiment of the present invention provides a semiconductor element that is manufactured using the photoresist composition described above.

The present invention will now be described in more detail by referring to the examples below, which are not intended to be limiting.

I. Preparation of Additive

EXAMPLE 1

To 1 L of tetrahydrofuran (THF) was added 0.1 mol of hexamethylene diisocyanate of Formula 17. To this mixture, 0.2 mol of 1,3,3'-trimethyl-6-azabicyclo[3.2.1]octane of Formula 18 was slowly added via an addition funnel. The reaction mixture was stirred for about 3 hours, after which it was concentrated and the resulting residue was diluted with distilled water to produce a yellow precipitate, which was dried in a vacuum at room temperature to obtain the additive of chemical Formula 2.

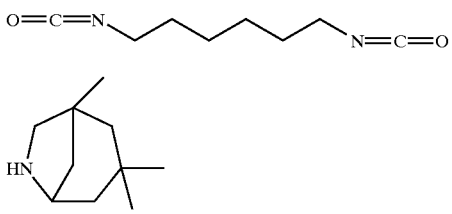

17

18

EXAMPLE 2

The procedure of Example 1 was repeated except 0.2 mol of diethylamine of Formula 19 was used instead of 1,3,3'-trimethyl-6-azabicyclo[3.2.1]octane of Formula 18, thereby obtaining the additive of Formula 3.

19

EXAMPLE 3

To a solution of 0.1 mol of tolylene 2,4-diisocyanate of Formula 20 in 1 L of tetrahydrofuran was slowly added 0.2 mol of 1,3,3'-trimethyl-6-azabicyclo[3.2.1]octane of Formula 18 via an addition funnel. The reaction mixture was stirred for about 3 hours. The product of white solid was filtered and dried, thereby obtaining the additive of Formula 4.

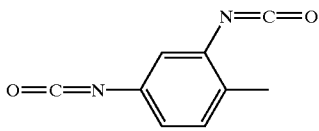

20

EXAMPLE 4

The procedure of Example 3 was repeated except 0.2 mol of diethylamine of Formula 19 was used instead of 1,3,3'-trimethyl-6-azabicyclo[3.2.1]octane of Formula 18, thereby obtaining the additive of Chemical Formula 5.

EXAMPLE 5

The procedure of Example 3 was repeated except 0.2 mol of aniline of Formula 21 was used instead of 1,3,3'-trimethyl-6-azabicyclo[3.2.1]octane of Formula 18, thereby obtaining the additive of Formula 6.

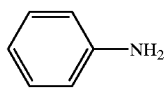

21

EXAMPLE 6

To a dissolved solution of 0.1 mol of 1,3-phenylenediamine of Chemical Formula 22 in 1 L of tetrahydrofuran (THF) was slowed added a solution of 0.2 mol of phenyl isocyanate of Formula 23 in 100 mL of THF via an addition funnel. The reaction mixture was stirred for about 3 hours, and the white solid was filtered and dried to obtain the additive of Formula 7.

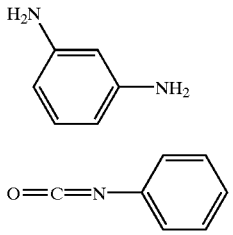

22

23

EXAMPLE 7

The procedure of Example 6 was repeated except 0.1 mol of 4,4'-oxydianiline of Formula 24 was used instead of 1,3-phenylenediamine of Formula 22 to obtain the additive of Formula 8.

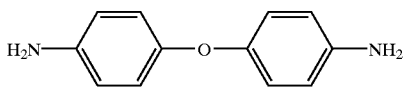

24

EXAMPLE 8

To a solution of 0.1 mol of phenyl isocyanate in 500 mL of tetrahydrofuran was slowly added 0.1 mol of 1,3,3'-trimethyl-6-azabicyclo[3.2.1]octane of Formula 18 via an addition funnel. The reaction mixture was stirred for about 3 hours and concentrated. The residue was diluted with distilled water, and a light yellow precipitate was filtered and dried in a vacuum at room temperature to obtain the additive of Formula 9.

EXAMPLE 9

The procedure of Example 8 was repeated except 0.2 mol of aniline was used instead of 1,3,3'-trimethyl-6-azabicyclo[3.2.1]octane of Formula 18 to obtain the additive of Formula 10.

II. Preparation of Photoresist Composition and Formation of Pattern

EXAMPLE 10

To 7.2 g of propylene glycol methyl ether acetate was added 1 g of poly(2-hydroxyethyl 5-norbomene-2-carboxylate/t-butyl 5-norbornene-2-carboxylate/5-norbornene-2-carboxylic acid/maleic anhydride), 0.012 g of triphenylsulfonium triflate, and 0.003 g of the compound of Formula 2. The resulting mixture was filtered through a micro-filter.

The filtered photoresist composition was coated on a wafer pretreated with hexamethyl disilazane, soft-baked at 150° C. for 90 seconds, exposed to light using an ArF exposer with gradual increase in the exposure energy from 10 mJ/cm$^2$ to 50 mJ/cm$^2$ by 1 J/cm$^2$ increments, and left standing for 30 minutes under 35 ppb amine contaminated environment. The photoresist composition was post-baked at 140 ° C. for 90 seconds, and developed in 2.38 wt % aqueous TMAH solution to obtain 0.15 μm L/S pattern (see FIG. 1).

EXAMPLE 11

Figure 2:
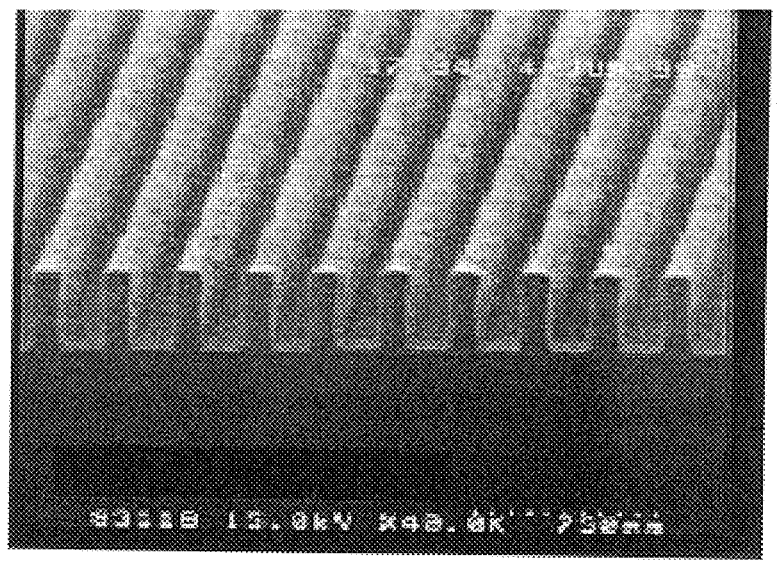
FIG. 2 shows a photoresist pattern obtained in Example 11.

The procedure of Example 10 was repeated except the additive of Formula 3 was used instead of the additive of Formula 2 to obtain L/S pattern of 0.15 μm (see FIG. 2).

EXAMPLE 12

Figure 3:
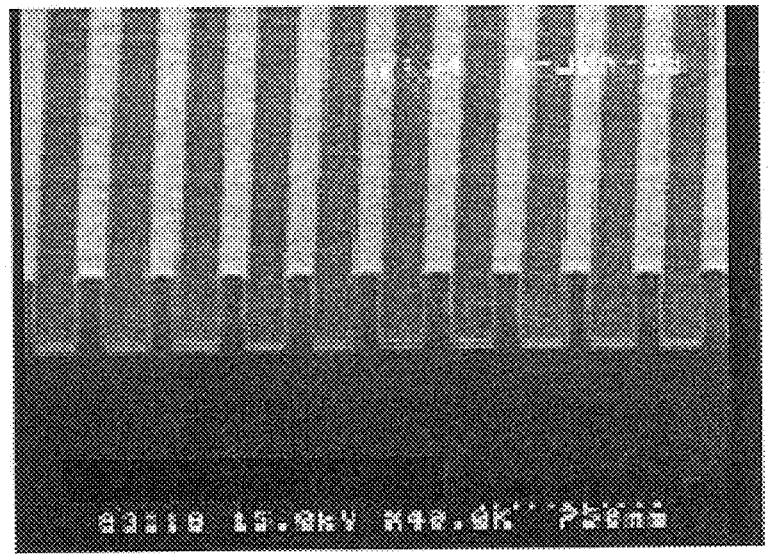
FIG. 3 shows a photoresist pattern obtained in Example 12.

The procedure of Example 10 was repeated except the additive of Formula 4 was used instead of the additive of Formula 2 to obtain L/S pattern of 0.15 μm (see FIG. 3).

EXAMPLE 13

Figure 4:
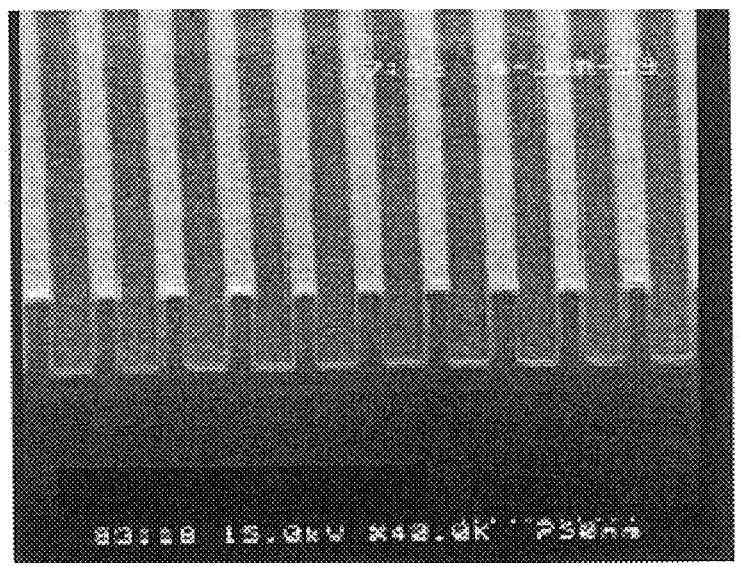
FIG. 4 shows a photoresist pattern obtained in Example 13.

The procedure of Example 10 was repeated except the additive of Formula 5 was sued instead of the additive of Formula 2 to obtain L/S pattern of 0.15 μm (see FIG. 4).

EXAMPLE 14

Figure 5:
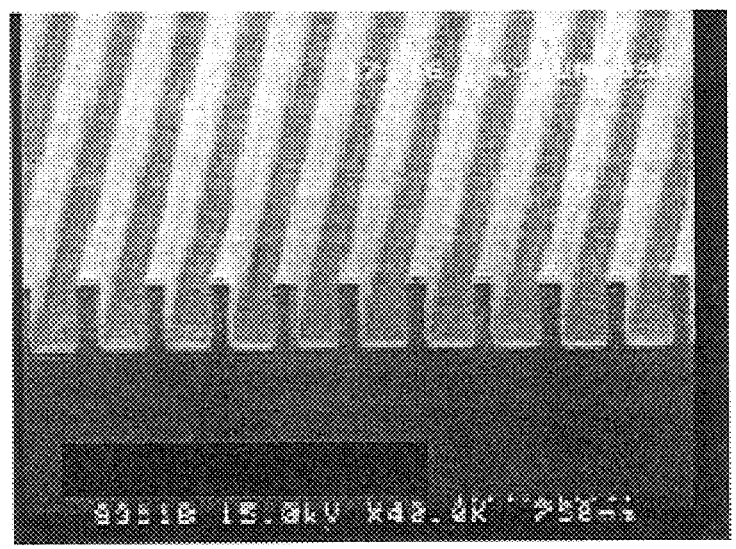
FIG. 5 shows a photoresist pattern obtained in Example 14.

The procedure of Example 10 was repeated except the additive of Formula 6 was used instead of the additive of Formula 2 to obtain L/S pattern of 0.15 μm (see FIG. 5).

EXAMPLE 15

Figure 6:
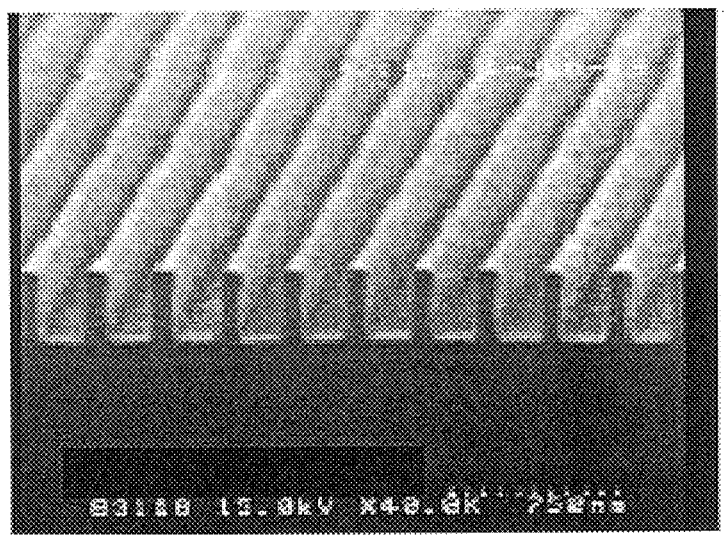
FIG. 6 shows a photoresist pattern obtained in Example 15.

The procedure of Example 10 was repeated except the additive of Formula 7 was used instead of the additive of Formula 2 to obtain L/S pattern of 0.15 μm (see FIG. 6).

EXAMPLE 16

Figure 7:
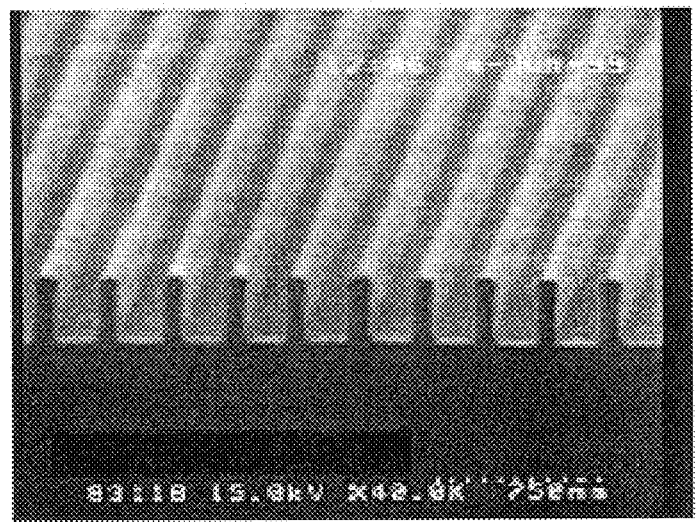
FIG. 7 shows a photoresist pattern obtained in Example 16.

The procedure of Example 10 was repeated except the additive of Formula 8 was used instead of the additive of Formula 2 to obtain L/S pattern of 0.15 μm (see FIG. 7).

EXAMPLE 17

Figure 8:
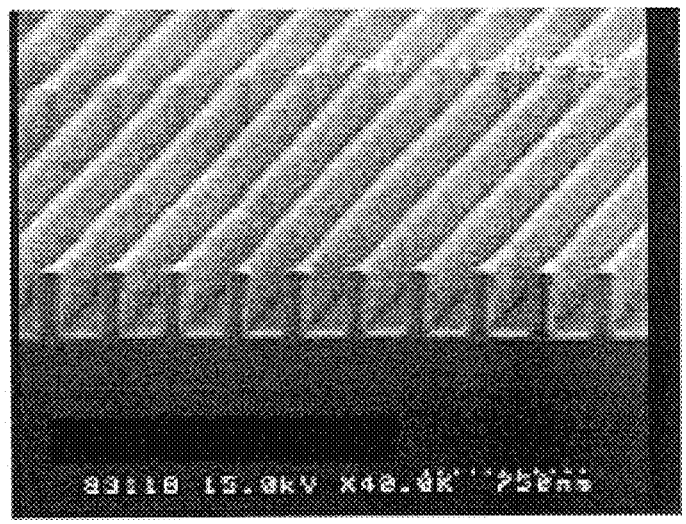
FIG. 8 shows a photoresist pattern obtained in Example 17.

The procedure of Example 10 was repeated except the additive of Formula 9 was used instead of the additive of Formula 2 to obtain L/S pattern of 0.15 μm (see FIG. 8).

EXAMPLE 18

Figure 9:
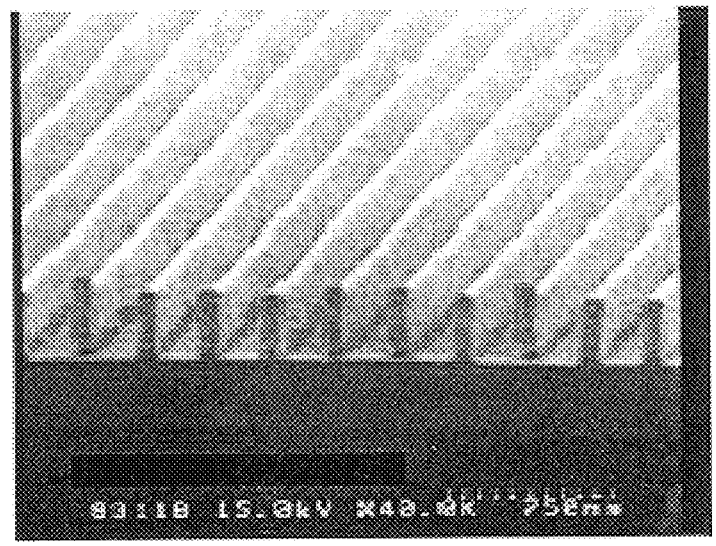
FIG. 9 shows a photoresist pattern obtained in Example 18.

The procedure of Example 10 was repeated except the additive of Formula 10 was used instead of the additive of Formula 2 to obtain L/S pattern of 0.15 μm (see FIG. 9).

Comparative Example

The procedure of preparing the photoresist composition in Example 10 was repeated without using the additive.

Figure 10:
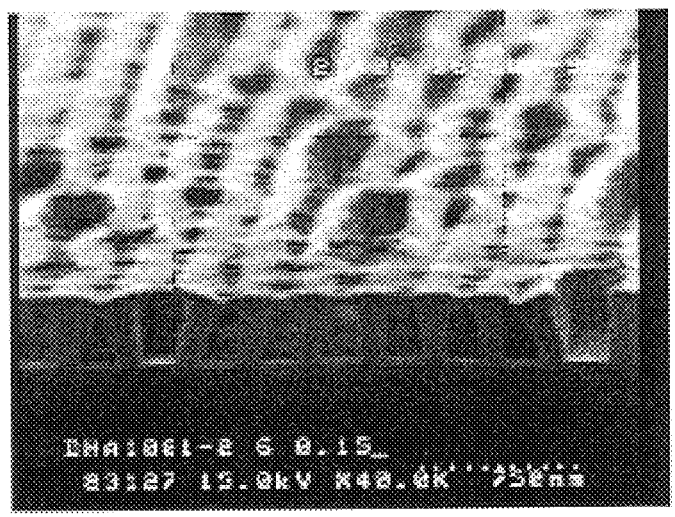
FIG. 10 shows a photoresist pattern obtained in Comparative Example.

When the photoresist composition was tested in the same manner as Example 10, a T-top phenomenon occurred (see to FIG. 10).

As the above examples show, when there is a post-exposure delay for a substrate comprising a photoresist composition that lacks an additive of the present invention, T-top occurs. However, when the substrate is coated with a photoresist composition comprising an additive of the present invention, the 150 nm L/S pattern forms cleanly even when there is a post-exposure delay prior to developing the substrate.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist composition comprising a photoresist resin, an organic solvent, a photoacid generator and a post exposure delay stability improving additive of the formula:

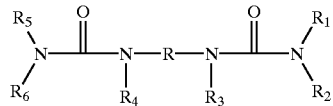

wherein

R is substituted or unsubstituted linear or branched $(C_1-C_{20})$ alkylene, substituted or unsubstituted $(C_6-C_{20})$ arylene, substituted or unsubstituted $(C_1-C_{20})$ alkylene comprising an ether linkage, or substituted or unsubstituted $(C_6-C_{20})$ arylene comprising an ether linkage; and $R_1$ to $R_6$ are independently hydrogen, substituted or unsubstituted linear or branched $(C_1-C_{20})$ alkyl or substituted or unsubstituted $(C_6-C_{20})$ aryl; or $R_1$ and $R_2$, $R_5$ and $R_6$, or $R_3$ and $R_7$ taken together with the nitrogen to which they are attached forms a cyclic or a bicyclic moiety.

2. The composition according to claim 1, wherein said photoresist resin comprises chemically amplified photoresist resins.

3. The composition according to claim 2, wherein said photoresist resin is poly(2-hydroxyethyl 5-norbornene-2-carboxylate/t-butyl 5-norbornene-2-carboxylate/5-norbornene-2-carboxylic acid/maleic anhydride).

4. The composition according to claim 1, wherein said photoacid generator is a sulfide or onium type compound.

5. The composition according to claim 1, wherein said photoacid generator comprises a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

6. The composition according to claim 1, wherein the amount of said photoacid generator is from about 0.05 to about 10% by weight of said photoresist resin.

7. The composition according to claim 1, wherein the amount of said additive is from about 1 to about 50% by weight of said photoacid generator.

8. The composition according to claim 1, wherein said organic solvent is selected from the group consisting of methyl 3-methoxypropionate, ethyl 3-ethoxypropionate, propylene glycol methyl ether acetate, cyclohexanone, 2-heptanone, (2-methoxy)ethyl acetate, and mixture thereof.

9. The composition according to claim 1, wherein said organic solvent comprises from about 200 to 1000% by weight of said photoresist resin.

10. A process for forming a photoresist pattern, comprising the steps of:

(a) coating said photoresist composition of claim 1 on a substrate to form a photoresist film;

(b) exposing said photoresist film to light by using an exposer; and (c) developing said exposed photoresist film.

11. The process according to claim 10, further comprising a baking step before and/or after said exposure step (b).

12. The process according to claim 11, wherein said baking step is performed at 70 to 200° C.

13. The process according to claim 10, wherein said exposer is selected from the group consisting of ArF, KrF, VUV, EUV, E-beam, X-ray and ion beam.

14. The process according to claim 10, wherein said step of exposing the photoresist film comprises irradiating said photoresist film using the exposer at an exposure engery level of from about 1 mJ/cm$^2$ to about 100 mJ/cm$^2$.

15. A semiconductor element produced by the process according to claim 10.

16. The photoresist of claim 1, wherein the post exposure delay stability improving additive is selected from the group consisting of:

17. A method for improving a post exposure delay stability in a photoresist composition comprising adding an additive of the formula:

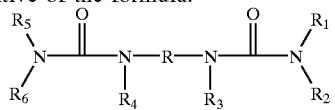

wherein

R is substituted or unsubstituted linear or branched ($C_1$–$C_{20}$) alkylene, substituted or unsubstituted ($C_6$–$C_{20}$) arylene, substituted or unsubstituted ($C_1$–$C_{20}$) alkylene comprising an ether linkage, or substituted or unsubstituted ($C_6$–$C_{20}$) arylene comprising an ether linkage; and $R_1$ to $R_6$ are independently hydrogen, substituted or unsubstituted linear or branched ($C_1$–$C_{20}$) alkyl or substituted or unsubstituted ($C_6$–$C_{20}$) aryl; or $R_{1\ and\ R2}$, $R_5$ and $R_6$, or $R_3$ and $R_7$ taken together with the nitrogen to which they are attached forms a cyclic or a bicyclic moiety.

18. The method of claim 17, wherein the additive is selected from the group consisting of:

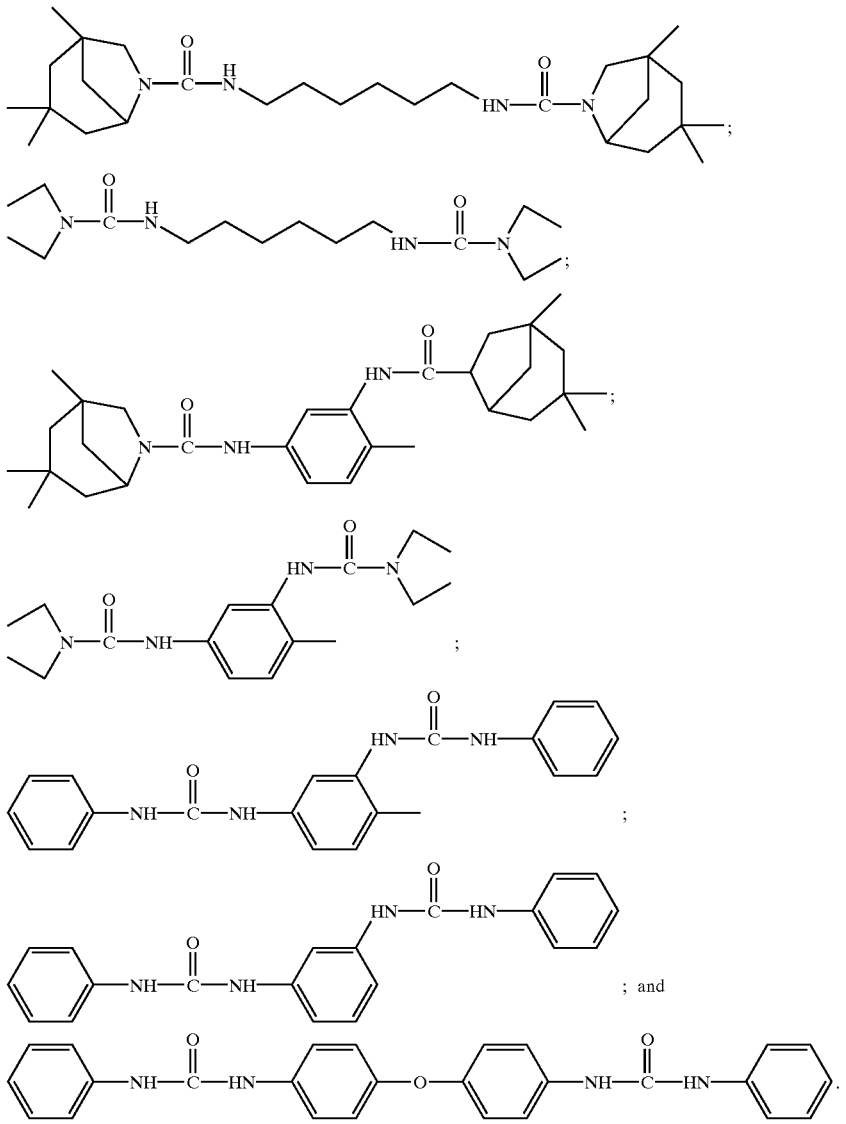

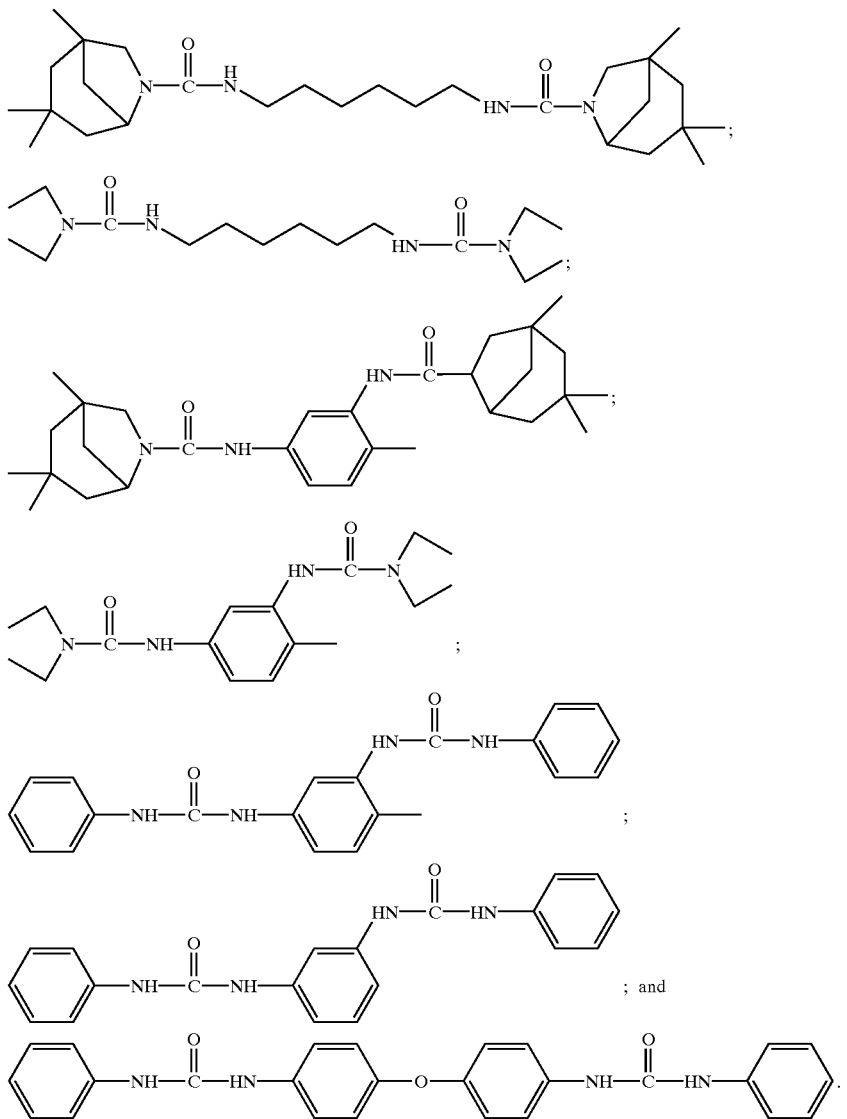

UNITED STATES PATENT AND TRADEMARK OFFICE
CERTIFICATE OF CORRECTION

PATENT NO. : 6,514,665 B1
DATED : February 4, 2003
INVENTOR(S) : Jae Chang Jung et al.

It is certified that error appears in the above-identified patent and that said Letters Patent is hereby corrected as shown below:

Column 4,
Lines 40-50, the Formula 4 should read
--

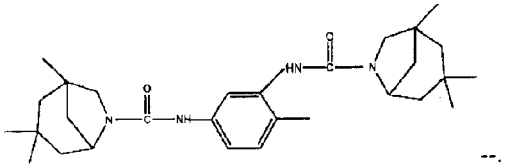

--.

Column 7,
Lines 39-42, the phrase

"poly(2-hydroxyethyl 5-norbornene-2-carboxylate/t-butyl 5-norbomene-2-carboxylate/5-norbornene-2-carboxylic acid/maleic anhydride)" should read --poly(2-hydroxyethyl 5-norbornene-2-carboxylate/t-butyl 5-norbornene-2-carboxylate/5-norbornene-2-carboxylic acid/maleic anhydride)--.

Column 10,
Lines 52-54, the phrase

"poly(2-hydroxyethyl 5-norbomene-2-carboxylate/t-butyl 5-norbornene-2-carboxylate/5-norbornene-2-carboxylic acid/maleic anhydride)" should read --poly(2-hydroxyethyl 5-norbornene-2-carboxylate/t-butyl 5-norbornene-2-carboxylate/5-norbornene-2-carboxylic acid/maleic anhydride)--.

Column 13,
Lines 13-16, the claim

"The process according to claim 10, wherein said step of exposing the photoresist film comprises irradiating said photoresist film using the exposer at an exposure engery level of from about 1 mJ/cm$^2$ to about 100 mJ/cm$^2$." should read --The process according to claim 10, wherein said step of exposing the photoresist film comprises irradiating said photoresist film using the exposer at an exposure energy level of from about 1 mJ/cm$^2$ to about 100 mJ/cm$^2$.--

UNITED STATES PATENT AND TRADEMARK OFFICE
CERTIFICATE OF CORRECTION

PATENT NO. : 6,514,665 B1
DATED : February 4, 2003
INVENTOR(S) : Jae Chang Jung et al.

It is certified that error appears in the above-identified patent and that said Letters Patent is hereby corrected as shown below:

Column 13, cont'd,
Lines 35-45, the third Formula should read
--

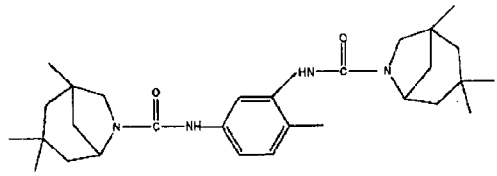

--.

Column 14,
Lines 1-19, the claim "A method for improving a post exposure delay stability in a photoresist composition comprising adding an additive of the formula:

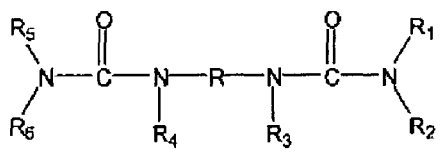

wherein

R is substituted or unsubstituted linear or branched ($C_1$-$C_{20}$) alkylene, substituted or unsubstituted ($C_6$-$C_{20}$) arylene, substituted or unsubstituted ($C_1$-$C_{20}$) alkylene comprising an ether linkage, or substituted or unsubstituted ($C_6$-$C_{20}$) arylene comprising an ether linkage; and $R_1$ to $R_6$ are independently hydrogen, substituted or unsubstituted linear or branched ($C_1$-$C_{20}$) alkyl or substituted or unsubstituted ($C_6$-$C_{20}$) aryl; or $R_{1\ and\ R2}$, $R_5$ and $R_6$, or $R_3$ and $R_7$ taken together with the nitrogen to which they are attached forms a cyclic or a bicyclic moiety."

should read --A method for improving a post exposure delay stability in a photoresist composition comprising a photoresist resin, an organic solvent, and a photoacid generator, said method comprising adding an additive of the formula:

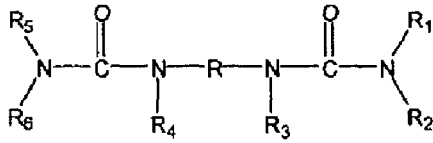

wherein

R is substituted or unsubstituted linear or branched ($C_1$-$C_{20}$) alkylene, substituted or unsubstituted ($C_6$-$C_{20}$) arylene, substituted or unsubstituted ($C_1$-$C_{20}$) alkylene comprising an ether linkage, or substituted or unsubstituted ($C_6$-$C_{20}$) arylene comprising an ether linkage; and $R_1$ to $R_6$ are independently hydrogen, substituted or unsubstituted linear or branched ($C_1$-$C_{20}$) alkyl or substituted or unsubstituted ($C_6$-$C_{20}$) aryl; or $R_1$ and $R_2$, $R_5$ and $R_6$, or $R_3$ and $R_7$ taken together with the nitrogen to which they are attached forms a cyclic or a bicyclic moiety.--.

UNITED STATES PATENT AND TRADEMARK OFFICE
CERTIFICATE OF CORRECTION

PATENT NO. : 6,514,665 B1
DATED : February 4, 2003
INVENTOR(S) : Jae Chang Jung et al.

It is certified that error appears in the above-identified patent and that said Letters Patent is hereby corrected as shown below:

Column 15,
Lines 10-20, the third Formula should read
--

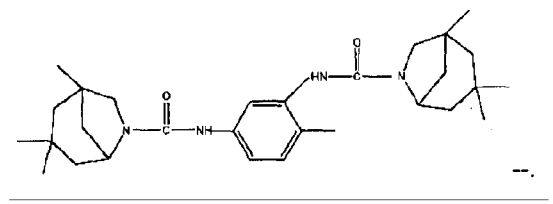

--.

Signed and Sealed this

Twenty-third Day of March, 2004

JON W. DUDAS
*Acting Director of the United States Patent and Trademark Office*